United States Patent [19]
Walton

[11] 4,092,057
[45] May 30, 1978

[54] FLEXIBLE CIRCUIT ASSEMBLY
[75] Inventor: Tommy L. Walton, Carlsbad, Calif.
[73] Assignee: Burroughs Corporation, Detroit, Mich.
[21] Appl. No.: 764,980
[22] Filed: Feb. 2, 1977

Related U.S. Application Data

[62] Division of Ser. No. 608,550, Aug. 28, 1975, Pat. No. 4,026,011.
[51] Int. Cl.² ............................................. H05K 1/04
[52] U.S. Cl. ........................... 339/17 F; 174/117 FF; 339/176 MF
[58] Field of Search ...................... 339/17 F, 176 MF; 174/117 F, 117 FF

[56] References Cited
U.S. PATENT DOCUMENTS

| 3,522,652 | 4/1970 | Gordon | 339/17 F |
| 3,805,213 | 4/1974 | Austin | 339/17 F |

Primary Examiner—Roy Lake
Assistant Examiner—E. F. Desmond
Attorney, Agent, or Firm—G. Gregory Schively; Mervyn L. Young; Kevin R. Peterson

[57] ABSTRACT

A flexible circuit assembly and a method of making it in which there are no separate electrical interconnections between the flexible interconnecting cable and the rigid connector. A flexible insulating film is bonded to a surface of the connector member and extends from the connector to provide a flexible interconnecting cable for external electrical connections. A plurality of conductors on the insulating film provides a continuous electrically conductive path thus providing an interfaceless electrical connection between the rigid connector and the flexible interconnecting cable. In the method, a metallic clad insulating film is placed on a surface of a rigid support member which includes a portion which will serve as the connector. The support member also includes a filler block portion in the space designated for the flexible interconnecting cable. The film is selectively bonded to the connector portion of the support member. Conductors are then formed on the insulating film. The filler block is then removed to leave a rigid connector and a flexible interconnecting cable which has a plurality of continuous conductors thereon thereby eliminating a separate electrical connection therebetween.

3 Claims, 10 Drawing Figures

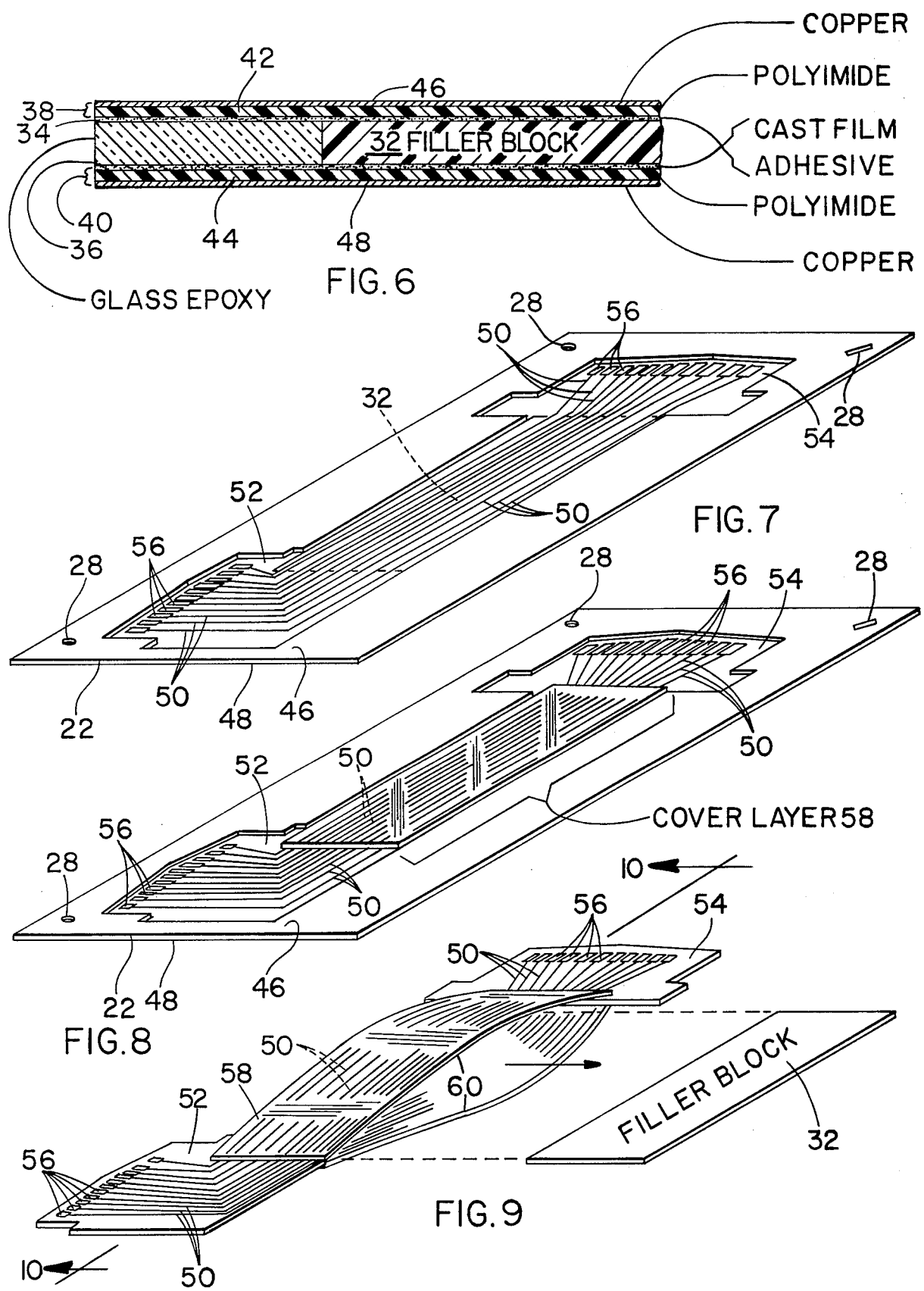

FLEXIBLE CIRCUIT ASSEMBLY

This is a division, of application Ser. No. 608,550, filed Aug. 28, 1975, now U.S. Pat. No. 4,026,011.

CROSS REFERENCE TO RELATED APPLICATION

Reference is made herein to U.S. Pat. application Ser. No. 608,457, entitled "Cover Layer For Flexible Circuits", filed Aug. 28, 1975, now U.S. Pat. No. 4,075,420, issued Feb. 21, 1978, having the same inventor and assignee as the present invention.

BACKGROUND OF THE INVENTION

This invention relates to connectors for electrical circuits. More particularly, it involves a flexible circuit assembly and a method of making it.

A typical flexible circuit assembly as embodied in the prior art is shown in FIG. 1. The flexible circuit assembly includes a flexible interconnecting cable 10 which includes a plurality of spaced parallel conductors 12 which are encapsulated by an upper and lower layer of a flexible insulating film 14. In most applications, the flexible interconnecting cable 10 connects two rigid edge connectors (one of which is shown in FIG. 1) which are adapted to engage an external female socket. One type of connector is formed on a printed circuit board 16 and includes a plurality of printed conductors 18 thereon which correspond with the conductors 12 in the flexible interconnecting cable 10. In order to make the electrical connections between the conductors 18 on the connector and the conductors 12 of the flexible cable 10, one had to strip the insulating film 14 to bare the ends of the conductors 12. Then, a separate electrical connection was made between the conductors 12 of the flexible cable 10 and the conductors 18 on the connector. One widely used method is to solder the corresponding conductors together as shown as designated by the numeral 20. This has proved to be an extremely time consuming operation. Furthermore, the reliability of the connection has not been entirely satisfactory, especially when it is realized that the space between adjacent conductors may be as small as 0.005 inches. Other methods have been contemplated to connect the flexible cable with the rigid connectors. However, they have also had similar disadvantages. In any case, the prior art has required that some kind of separate connection be made between the conductors on or in the connectors and the conductors of the flexible cable. In other words, the prior art has considered flexible circuit assemblies as a discrete three component system (two rigid connectors and the flexible interconnecting cable) and consequently, has required some kind of connection between each component.

SUMMARY OF THE INVENTION

It is, therefore, the primary object of this invention to provide a flexible circuit assembly and a method of making it, in which there are no separate interconnections between the flexible cable and the rigid connector.

Briefly, this invention accomplishes this objective by placing a flexible metallic clad insulating film on a surface of a rigid support member. The support member includes at least one portion which will later serve as the rigid connector. The support member also includes a filler block in the space desired to form the flexible interconnecting cable. The insulating film is then selectively bonded to the connector portion of the support member. Conductors are then formed on the insulating film to provide a plurality of continuous conductors on both the rigid connector portion and on the insulating film which is covering the filler block. The filler block is then removed to leave a flexible cable in the space in which the filler block previously occupied. However, the conductors provide a continuous interfaceless electrically conductive path on both the connector portion and the flexible cable since the insulating film has been previously bonded to the rigid connector portion of the support member. Accordingly, the time consuming and unreliable connections between the flexible cable and the rigid connector as required by the prior art is eliminated.

BRIEF DESCRIPTION OF THE DRAWINGS

FIG. 6 shows a partial sectional view along the line 6—6 of FIG. 5;

FIG. 7 shows a perspective view of the laminated support member shown in FIGS. 5 and 6 after a conductor pattern has been etched therein;

FIG. 8 shows a perspective view of the support member shown in FIG. 7 with the addition of a cover layer bonded to intermediate portions of the conductors;

FIG. 9 shows a perspective view of the flexible circuit assembly made in accordance with this invention after peripheral portions of the support member have been severed and the filler block removed.

DESCRIPTION OF A PREFERRED EMBODIMENT

Figures 2, 3:
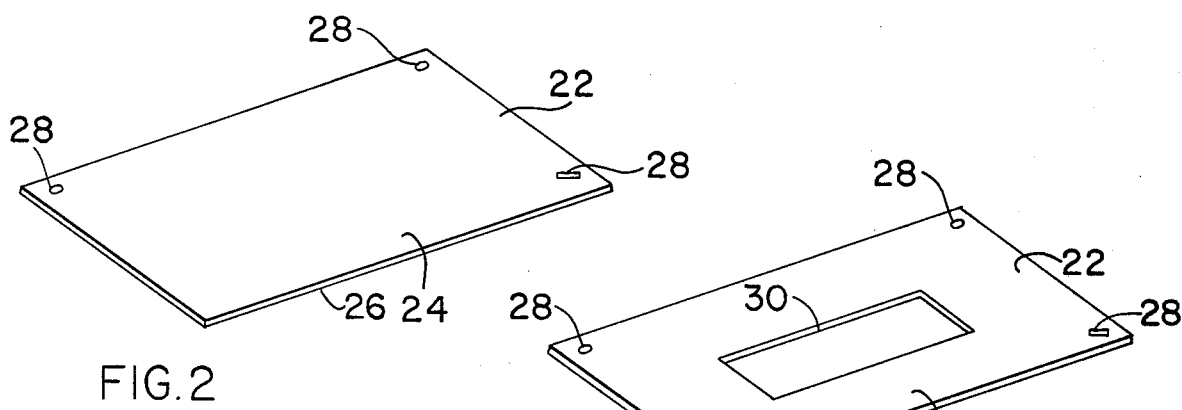
FIG. 2 shows a perspective view of a rigid support member during one step of the method of this invention.
FIG. 3 shows a perspective view of the support member during a succeeding step in the method of this invention.

Referring now to FIG. 2, there is shown a generally rectangular rigid support member 22. Support member 22 has two substantially flat parallel major surfaces, designated as upper surface 24 and lower surface 26. In this preferred embodiment, support member 22 is approximately 62 mils thick between major surfaces 24 and 26. Support member 22 serves as an insulating substrate and can be made of typical circuit board materials such as glass fibric base epoxy, paper base phenolic, or random glass fiber polyester. This group of materials include NEMA (National Electronics Manufacturers Association) XXXP; XXXPC; FR-2, 3, 4, and 5; G-10 and 11; and FR-6. As will become evident later in this description, the material for support member 22 is chosen to be that desired for the rigid connectors of the flexible circuit assembly. Tooling holes 28 can be punched into several of the corners of the support member to aid in registration with automated machinery.

Referring now to FIG. 3, an opening or slot 30 is cut into the support member 22. This can be accomplished, for example, by stamping techniques known in the art. The configuration of slot 30 is chosen to coincide with the configuration desired for the flexible interconnecting cable of the flexible circuit assembly. Consequently, the size and shape of slot 30 can be varied according to the length and shape desired for the flexible interconnecting cable.

Figures 4, 5:
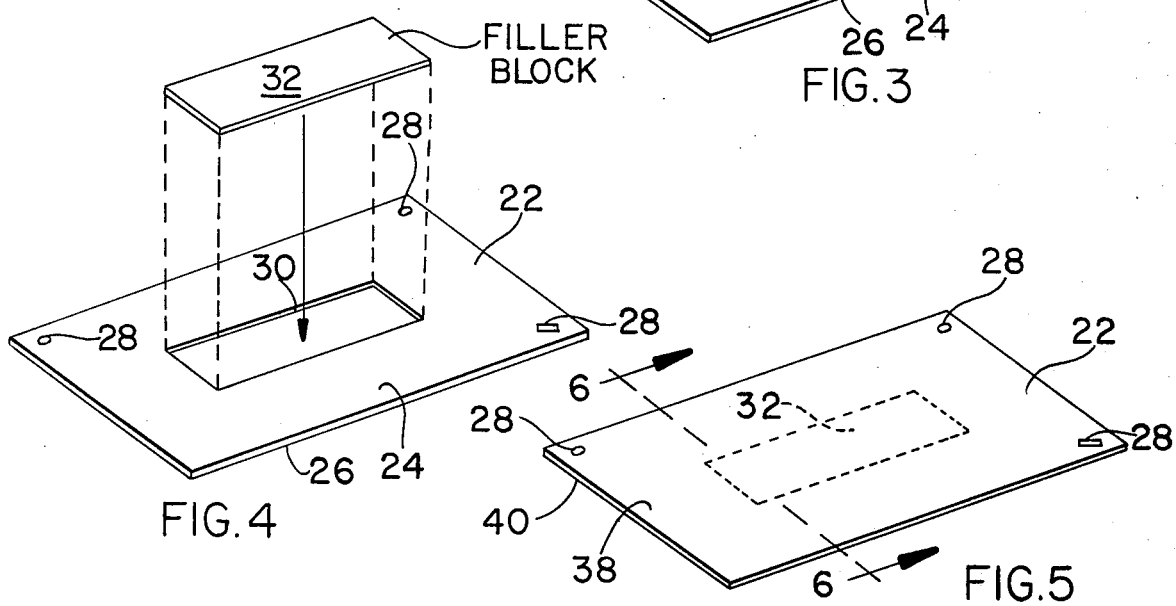
FIG. 4 shows an exploded perspective view of the support member and filler block portion during a succeeding step in the method of this invention.
FIG. 5 shows a perspective view of the assembled support member shown in FIG. 4 after a metallic clad insulating film has been bonded to the surfaces thereof.

Referring now to FIG. 4, a filler block 32 is inserted into the slot 30 of support member 22. Filler block 32 has the same peripheral dimensions as slot 30 and the same thickness as support member 22. In such manner, the filler block 32 fills the void left by slot 30. Filler block 32 is preferably made of a rigid material to which adhesives will not readily bond. A preferred material is "Teflon", a trademark of E. I. du Pont de Nemours and Company, Inc.

Referring now to FIG. 5, a metallic clad insulating film 38, 40 is bonded to the upper surface 24 and lower surface 26, respectively, of support member 22. As can be seen most clearly in FIG. 6, this is preferably accomplished by placing an adhesive cast film 34 and 36 on the upper surface 24 and lower surface 26, respectively. A metallic clad insulating film generally designated by the numerals 38 and 40 are placed on top of the adhesive film 34 and 36, respectively. The metallic clad insulating film 38, 40 includes a flexible sheet approximately three mils thick of "Kapton", a trademark of E. I. du Pont de Nemours and Company, Inc. for a polyimide film. Other materials which may be used for insulating film 42, 44 include polyvinyl chloride, polyolefins such as polyethylene or polypropylene, polytetraflouroethylene, and the like. On the outer surfaces of insulating film 42, 44 is a layer of metal, preferably copper. In this preferred embodiment, copper layers 46 and 48 are evenly distributed on insulating film 42 and 44 in the amount of approximately one ounce per square foot. The metallic clad insulating film 38, 40 may be that distributed by Fortin Laminating Corporation of San Fernando, California under the trade name "Poly-Core EPO31CO3". It should be noted also that adhesive layers 34 and 36 can be of any of the well known thermosetting adhesives which are used in flexible circuit technology. A preferred adhesive is a modified epoxy adhesive. A modified epoxy adhesive is an adhesive fabricated by combining standard epoxy resins with polyimide resins to form a thermosetting adhesive capable of withstanding high temperatures. As is also known in the art, the copper layers 46 and 48 may have been previously bonded to insulating film 42 and 44 by a similar thin layer of a modified epoxy adhesive (not shown).

After the various layers have been positioned as shown in FIGS. 5 and 6, they are selectively bonded to surfaces 24 and 26 of support member 22. However, they are not bonded to the filler block 32. This is accomplished by laminating the layers together in a hydraulic press which is heated to about 340° F ± 10° F at a pressure of about 50–500 pounds per square inch, for approximately 45–60 minutes. As a particular example, lamination takes place at 340° F at 250 psi for 60 minutes. The adhesive layers 34 and 36 bond the metallic clad insulating film 38 and 40, respectively, to the support member 22. However, the adhesive layers 34 and 36 will not bond to the Teflon filler block 32. If an epoxy adhesive is used for layers 34 and 36 the epoxy will simply set into a flexible non-sticky layer which will be bonded to the insulating film and support member 22 but not to the Teflon filler block 32. It should be noted that the time temperature and pressure during lamination can be varied as known in the art depending upon the materials used and the co-dependency between the time, heat, and pressure factors, etc.

For the remaining description of this invention, reference will be made to processing only the upper surface of the laminated support member. However, it should be realized that the same processing takes place on the lower surface as well. Referring now to FIG. 7, the next step in the method of this invention is to etch copper layer 46 to form a plurality of spaced conductors 50. Portions of the support member 22 are also etched in the configuration desired for the rigid connectors for the flexible circuit assembly. Connector portions 52 and 54 abut the end portions of the filler block 32. It is important to note, however, that only the copper is etched away and that the insulating film still remains covering the support member 22 and filler block 32. Copper layer 46 can be etched using known photolighographic techniques known in flexible circuit technology. Briefly, this is accomplished by applying a photoresist to copper layer 46, exposing a desired circuit pattern using opaque masks, and then developing the resist. The developed photoresist is then washed away leaving selected portions of the copper layer exposed in the desired circuit pattern. A thin layer of a tin and lead alloy is then electroplated onto the exposed copper. The remaining photoresist is then stripped away. Then the portions of the copper layer 46 which are not covered by the tin and lead alloy are then etched away using a suitable etchant such as ammonium persulphate. For ease of illustration, the tin and lead alloy is not shown in the drawings.

As shown in FIG. 7, the copper has been etched only in the areas defined by the two connector portions 52 and 54 and the area defined by the filler block 32. The conductors 50 were originally a part of copper layer 46. The conductors 50 are also etched in such manner that they terminate at each end in an enlarged contact pad 56. The contact pads 56 provide an enlarged electrically conductive area for making connection with corresponding clips in a female external socket (not shown). The contact pads terminate near the outer edge of the connector portions 52 and 54. Accordingly, the conductors 50 provide a continuous, interfaceless electrically conductive path between the contact pads 56 on connector portion 52 and the contact pads 56 on the connector portion 54. The contact pads 50 can be plated with gold or other metal to enhance electrical conductivity.

Referring now to FIG. 8, a cover layer 58 is bonded or laminated to the flexible insulating film 42 to cover intermediate portions of conductors 50 which cover the filler block 32. Cover layer 58 may be the same as that disclosed and claimed in U.S. Pat. application Ser. No. 608,457, entitled, "Cover Layer For Flexible Circuits", now U.S. Pat. No. 4,075,420, issued Feb. 21, 1978, having the same inventor and assignee as the present invention. Briefly, the cover layer of that application is a tri-layered laminate having a first outer layer of an insulating film, such as Kapton; a second intermediate layer of a modified epoxy adhesive; and a third layer of a phenolic resin adhesive which is bonded contiguous to the conductors. The cover layer 58 is bonded in the same manner as the metallic clad insulating film 38 and 40 is bonded to support member 22 as set out hereinbefore. It should be noted, however, that commercially available cover layers may also be used and bonded in the same manner. Once such commercially available cover layer would be an insulating film of Kapton having a single layer of an adhesive coating on one surface thereof.

Referring now to FIG. 9, peripheral portions of the support member 22 are cut away leaving the areas defined by the connector portions 52 and 54 and the filler block 32. This can be accomplished by known stamping techniques. The filler block 32 is then removed between the upper and lower layers of the flexible insulating film as shown in the drawings.

Figure 1:
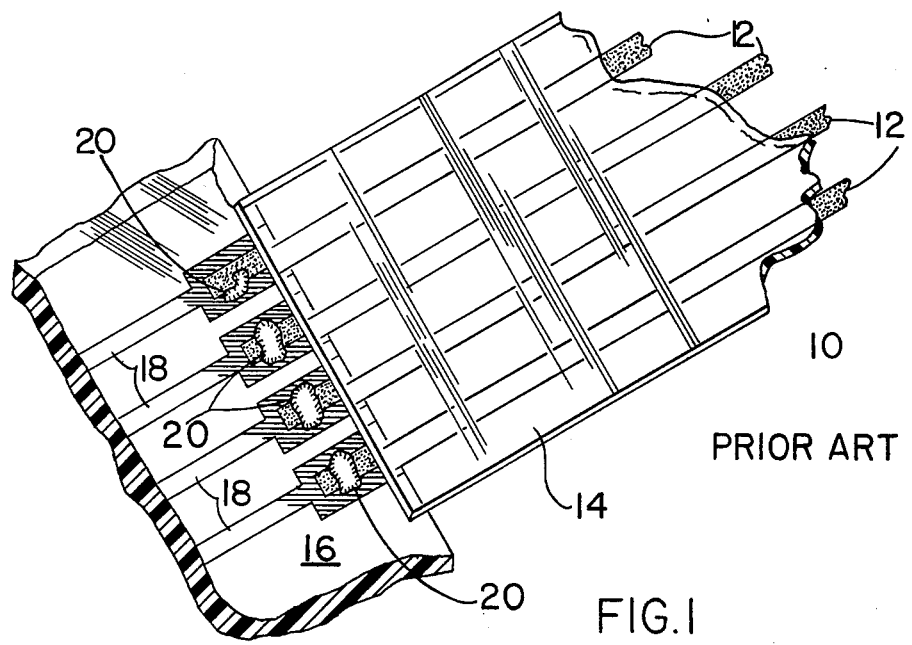
FIG. 1 shows a perspective view of an example of the prior art which requires a separate electrical connection between the flexible cable and the rigid connector.
Figure 10:
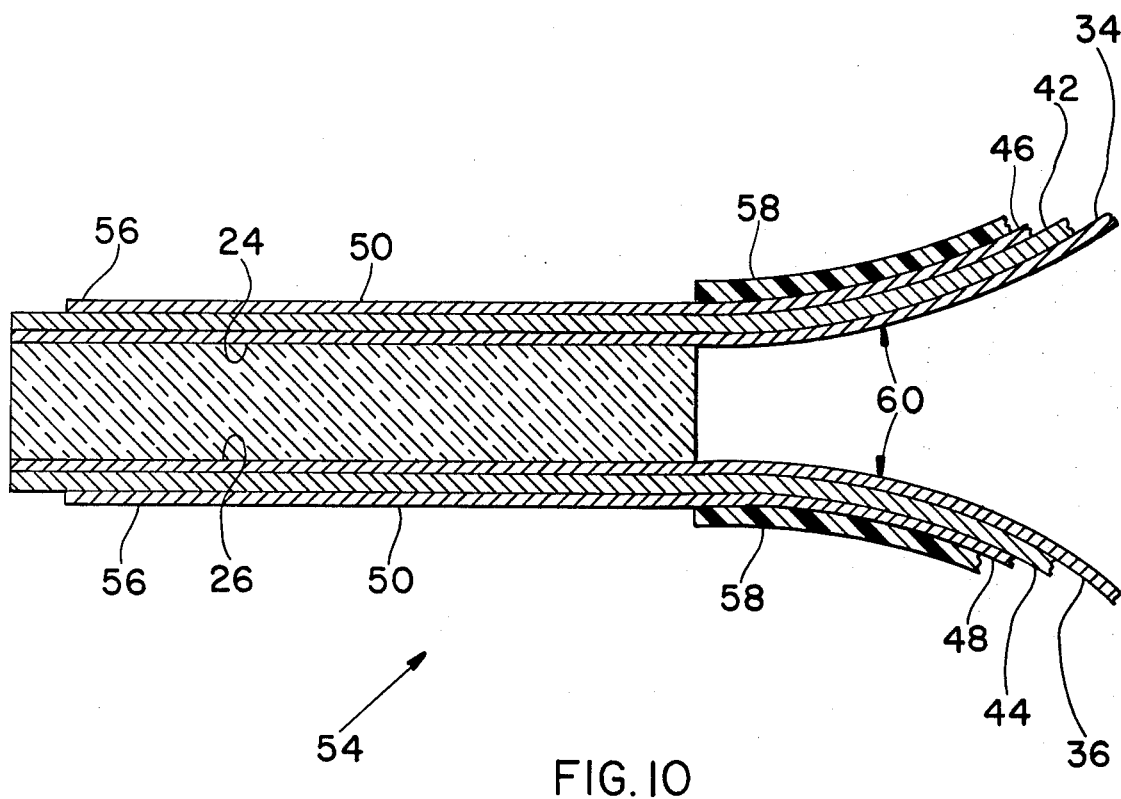
FIG. 10 shows an enlarged longitudinal partial sectional view of a rigid connector and attached flexible cable made in accordance with this invention.

Referring again to FIG. 9, there remains a flexible circuit assembly as embodied in this invention. The flexible circuit assembly includes two rigid connectors 52 and 54 which are connected together by an upper and lower interconnecting cable 60. A plurality of spaced parallel conductors 50 run continuously from the contact pads 56 on connector member 52, through flexible interconnecting cable 60 and terminate at the contact pads 56 on rigid connector member 54. The conductors 50 in the flexible interconnecting 60 are covered by a cover layer 58 which electrically insulates the conductors and protects them from adverse environmental conditions. It is now evident that the flexible circuit assembly of this invention provides at least one rigid connector member and a flexible interconnecting cable which does not require any separate electrical connection therebetween as required in the prior art shown in FIG. 1. Instead, as can be seen most clearly in FIG. 10, the conductors 50 provide an interfaceless electrically conductive path on both the rigid connector 52 and the flexible interconnecting cable 60.

The flexible circuit assembly of this invention can be made using commercially available materials and can be manufactured using familiar processing steps used in flexible circuit technology. However, the time and expense of making a separate electrical connection between the flexible cable and a rigid connector is eliminated. Furthermore, the reliability of the electrical connection is substantially improved. It should be noted that the length and configurations of the flexible interconnecting cable 60 can be easily modified to accommodate various design criteria. Furthermore, the size and shape of the rigid connectors can be similarly varied. Furthermore, it is not necessary that two rigid connectors be made simultaneously, if, for example, another type of connector is desired to be used at one end. However, if such a connector should be used, a separate electrical connection is required to be made thereto.

Therefore, while this invention has been described in connection with a certain specific example thereof, no limitation is intended thereby except as defined in the appended claims.

I claim:

1. A flexible circuit assembly having a rigid connector and a flexible interconnecting cable which does not require a separate electrical connection therebetween, said assembly comprising:
    a rigid support member having a major surface and serving as a rigid connector;
    a metallic clad insulating film bonded to said surface and extending from said rigid connector; and
    a plurality of spaced conductors on said insulating film, said conductors each having an enlarged portion, as an integral part thereof, at one end terminating on said rigid connector to form a contact pad and another end on the insulating film spaced from the rigid connector, each conductor and corresponding pad portion thereby providing a metallurgically continuous one piece interfaceless electrically conductive path from the rigid connector end to the insulating film which extends from the rigid connector, the combination serving as a flexible interconnecting cable.

2. An integral flexible circuit assembly having rigid connectors and an interconnecting flexible cable which requires no separate electrical connections therebetween, said assembly comprising:
    at least two spaced rigid support members each having a major surface and each serving as a rigid connector, each rigid connector having an edge for engaging in an external socket;
    an insulating film bonded to the surfaces of said rigid connectors and connecting said rigid connectors together in a spaced apart manner;
    a plurality of spaced continuous conductors on said insulating film, each conductor having an enlarged contact pad as a portion thereof near the edge of each rigid connector; and
    said insulating film bridging said rigid connectors and serving as a flexible cable, each conductor and corresponding contact pad providing a metallurgically continuous interfaceless one piece electrical conductive path between the edges of said rigid connectors without requiring separate electrical connection between the flexible cable and the rigid connectors.

3. The flexible circuit assembly of claim 2 wherein the insulating film is bonded to the rigid connectors with a thermosetting adhesive.

* * * * *